(12) United States Patent
Kim et al.

(10) Patent No.: US 9,064,756 B2
(45) Date of Patent: Jun. 23, 2015

(54) THIN FILM TRANSISTOR ARRAY PANEL AND MANUFACTURING METHOD THEREOF

(71) Applicant: Samsung Display Co., Ltd., Yongin, Gyeonggi-Do (KR)

(72) Inventors: Hyun-Young Kim, Yongin (KR); Sung-In Ro, Yongin (KR); Cheoll-Hee Jeon, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/077,002

(22) Filed: Nov. 11, 2013

(65) Prior Publication Data
US 2014/0065749 A1 Mar. 6, 2014

Related U.S. Application Data

(62) Division of application No. 13/159,317, filed on Jun. 13, 2011, now Pat. No. 8,581,312.

(30) Foreign Application Priority Data

Nov. 11, 2010 (KR) .......................... 10-2010-0112206

(51) Int. Cl.
| | |
|---|---|
| *H01L 21/00* | (2006.01) |
| *H01L 27/12* | (2006.01) |
| *G02F 1/1345* | (2006.01) |
| *G02F 1/1362* | (2006.01) |
| *H01L 21/28* | (2006.01) |
| *H01L 21/283* | (2006.01) |
| *H01L 21/48* | (2006.01) |

(52) U.S. Cl.
CPC .......... *H01L 27/1259* (2013.01); *H01L 27/124* (2013.01); *H01L 27/1288* (2013.01); *G02F 1/13458* (2013.01); *G02F 1/136227* (2013.01); *G02F 2001/136236* (2013.01); *H01L 21/28008* (2013.01); *H01L 21/283* (2013.01); *H01L 21/4885* (2013.01)

(58) Field of Classification Search
CPC . H01L 21/775; H01L 27/12; H01L 29/66757; H01L 29/66765; H01L 29/78621
USPC ........................................ 438/149, 155, 291
See application file for complete search history.

(56) References Cited

U.S. PATENT DOCUMENTS 7,369,202 B2 * 5/2008 Ahn et al. ..................... 349/141

FOREIGN PATENT DOCUMENTS

| JP | 05-034717 A | 2/1993 |
|---|---|---|
| KR | 10-2002-0042924 A | 6/2002 |
| KR | 10-2004-0071898 A | 8/2004 |
| KR | 10-0915351 B1 | 8/2009 |

* cited by examiner

*Primary Examiner* — Quoc Hoang
(74) *Attorney, Agent, or Firm* — Christie, Parker & Hale LLP

(57) ABSTRACT

A thin film transistor array panel includes: a substrate including a display area and a drive region in which a driving chip for transmitting a driving signal to the pixels is located; a gate line in the display area; a storage electrode line; a gate driving pad coupled to the driving chip; a gate insulating layer; a first semiconductor layer on the gate insulating layer and overlapped with a gate electrode protruding from the gate line; a second semiconductor layer formed on the gate insulating layer and overlapped with a sustain electrode protruding from the storage electrode line; a data line crossing the gate line in an insulated manner and a drain electrode separated from the data line; and a pixel electrode coupled to the drain electrode, and the drain electrode comprises a drain bar facing the source electrode, and a drain extender overlapped with the second semiconductor layer.

20 Claims, 11 Drawing Sheets

THIN FILM TRANSISTOR ARRAY PANEL AND MANUFACTURING METHOD THEREOF

CROSS-REFERENCE TO RELATED APPLICATION

This application is a divisional of U.S. patent application Ser. No. 13/159,317, filed Jun. 13, 2011, which claims priority to and the benefit of Korean Patent Application No. 10-2010-0112206, filed Nov. 11, 2010, the entire content of both of which is incorporated herein by reference.

BACKGROUND

1. Field

The described technology relates generally to a thin film transistor array panel and a manufacturing method thereof.

2. Description of Related Art

A liquid crystal display (LCD) is a flat panel display that is constituted by two array panels with electrodes and a liquid crystal layer interposed therebetween to control the amount of light transmitted by rearranging liquid crystal molecules of a liquid crystal layer by applying a signal to the electrodes.

A plurality of pixel electrodes are arranged in a matrix format on a thin film transistor array panel formed of two array panels. One common electrode covers the entire array panel on a common electrode array panel. Images are displayed on the liquid crystal display (LCD) by applying a different voltage to each pixel electrode. To achieve this purpose, a thin film transistor having three terminals for switching the voltage applied to the pixel electrode is connected to the pixel electrode, and a gate line for transmitting a signal for controlling the thin film transistor and a data line for transmitting a voltage to be applied to the pixel electrode are installed on the thin film transistor array panel.

The gate line transmits a gate signal generated by a gate driving circuit of a gate driving chip, and the data line transmits a data voltage generated by a data driving circuit of a data driving chip. The chip on glass (COG) mounting method for directly bonding the gate driving chip or the data driving chip to the thin film transistor array panel and the film on glass (FOG) mounting method for directly bonding the flexible printed circuit (FPC) on the thin film transistor array panel are applied.

The COG and FOG mounting methods use anisotropic conductive films to electrically and mechanically connect the driving chip and the flexible printed circuit (FPC) to the thin film transistor array panel.

In addition, it is possible to form a gate driving pad contact hole of the thin film transistor array panel connected to the gate driving chip and a semiconductor layer with a single mask, thereby reducing the manufacturing process and production costs.

In this instance, when bubbles are formed in a halftone photosensitive film for forming a gate driving pad contact hole and a semiconductor layer on the gate insulating layer, at a part corresponding to a sustain electrode, the bubbles may cause holes to be formed within the halftone photosensitive film, and a phenomenon may occur in which the sustain electrode and the drain electrode are shorted to look like a black dot because of the holes. Further, holes may also be formed in the halftone photosensitive film because of foreign particles introduced at a part of the semiconductor layer corresponding to the sustain electrode when the semiconductor layer is deposited, so the sustain electrode and the drain electrode may be shorted to look like a black dot because of these holes.

This is because a single halftone mask is used to form the gate driving pad contact hole and the semiconductor layer. The thickness of the halftone photosensitive film formed on the part corresponding to the sustain electrode is less than 9000 Å thick, so the holes for exposing the sustain electrode to the halftone photosensitive film may be generated because of the foreign particles that are greater than 9000 Å or the bubbles.

The above information disclosed in this Background section is only for enhancement of understanding of the background of the described technology, and therefore it may contain information that does not form the prior art that is already known in this country to a person of ordinary skill in the art.

SUMMARY

Aspects of embodiments according to the present invention provide a thin film transistor array panel for preventing a black dot generated when a sustain electrode and a drain electrode are shorted, and a manufacturing method thereof.

An exemplary embodiment provides a thin film transistor array panel including: a substrate comprising a display area in which a plurality of pixels are formed and a drive region in which a driving chip for transmitting a driving signal to the pixels is located; a gate line in the display area; a storage electrode line in the display area and separated from the gate line; a gate driving pad in the drive region and coupled to the driving chip; a gate insulating layer for covering the gate line, the storage electrode line, and the gate driving pad; a first semiconductor layer on the gate insulating layer and overlapped with a gate electrode protruding from the gate line; a second semiconductor layer on the gate insulating layer and overlapped with a sustain electrode protruding from the storage electrode line; a data line on the gate insulating layer and crossing the gate line in an insulated manner and a drain electrode separated from the data line; and a pixel electrode coupled to the drain electrode, wherein the drain electrode comprises a drain bar facing a source electrode protruding from the data line, and a drain extender overlapped with the second semiconductor layer.

The first semiconductor layer may overlap with the source electrode and the drain bar.

The first semiconductor layer may be separated from the second semiconductor layer.

The thin film transistor array panel may further include: a passivation layer covering the data line and having a first contact hole that exposes a drain extender of the drain electrode; and an organic layer on the passivation layer and having a second contact hole that exposes the drain extender of the drain electrode, wherein the pixel electrode is on the organic layer and is coupled to the drain electrode through the first contact hole and the second contact hole.

The pixel comprises a transmitting region, a reflecting region, and a reflecting electrode on the pixel electrode at the reflecting region.

The thin film transistor array panel may further include: a connecting member on the gate insulating layer of the drive region and coupled to the gate driving pad; and an auxiliary member on the organic layer and coupled to the connecting member.

The connecting member is coupled to the gate driving pad through a gate driving pad contact hole in the gate insulating layer, and the auxiliary member is coupled to the connecting member through a first connecting member hole in the passivation layer and a second connecting member hole in the organic layer.

A lead line of the driving chip may contact the auxiliary member.

According to another exemplary embodiment herein, a method for manufacturing a thin film transistor array panel includes: forming a gate line and a storage electrode line in a display area on a substrate for a plurality of pixels; forming a gate driving pad in a drive region on the substrate for a driving chip for transmitting a driving signal to the pixels; forming a gate insulating layer on the gate line, the storage electrode line, and the gate driving pad; forming a first semiconductor layer overlapping a gate electrode protruding from the gate line on the gate insulating layer; forming a second semiconductor layer overlapped with a sustain electrode protruding from the storage electrode line; forming on the gate insulating layer a data line crossing the gate line and a drain electrode separated from the data line, the data line being insulated from the gate line, and the drain electrode comprising a drain bar facing a source electrode protruding from the data line, and a drain extender overlapping with the second semiconductor layer; and forming a pixel electrode coupled to the drain electrode.

The first semiconductor layer may overlap the source electrode and the drain bar.

The first exposer may be located at a position corresponding to the first semiconductor layer and the second semiconductor layer.

The first exposer may have a thickness from 10,000 Å to 50,000 Å, and the second exposer has a thickness of 5,000 Å to 30,000 Å.

When the second exposer is removed, the first exposer may become thinner.

The forming of the first semiconductor layer and the second semiconductor layer may include: forming a semiconductor layer on the gate insulating layer; forming a halftone photosensitive film including a first exposer, a second exposer that is thinner than the first exposer, and a third exposer for exposing the semiconductor layer on the semiconductor layer; forming a gate driving pad contact hole for exposing the gate driving pad by etching the semiconductor layer and the gate insulating layer through the third exposer; etching back the halftone photosensitive film to remove the second exposer to expose the semiconductor layer; and forming the first semiconductor layer and the second semiconductor layer by etching the semiconductor layer by using the first exposer as a mask.

The method may further include: forming a passivation layer for covering the source electrode and drain electrode; forming an organic layer on the passivation layer; and forming a first contact hole and a second contact hole for exposing a drain extender of the drain electrode in the passivation layer and the organic layer, respectively.

The method may further include, when the source electrode and the drain electrode are formed, forming a connecting member connected to the gate driving pad through the gate driving pad contact hole.

The method may further include forming a reflecting electrode on a pixel electrode of a reflecting region of each of the plurality of pixels.

The method may further include: forming a passivation layer for covering the source electrode and the drain electrode; forming a first contact hole in the passivation layer to expose a drain extender of the drain electrode; forming an organic layer on the passivation layer; and exposing the drain extender of the drain electrode by forming a second contact hole in the organic layer at a position corresponding to the first contact hole.

The method may further include, when the source electrode and the drain electrode are formed, forming a connecting member connected to the gate driving pad through the gate driving pad contact hole.

The method may further include, when the first contact hole and the second contact hole are formed, forming a first connecting member hole and a second connecting member hole for exposing the connecting member in the passivation layer and the organic layer, respectively, at the drive region.

The method may further include, when the pixel electrode is formed, forming an auxiliary member coupled to the connecting member through the first connecting member hole and the second connecting member hole on the organic layer at the drive region.

According to the embodiments, when the gate driving pad contact hole and the semiconductor layer are formed with a single halftone mask, a second semiconductor layer is formed on a part corresponding to the sustain electrode to prevent the sustain electrode and the drain electrode from being shorted when foreign particles or bubbles are provided on the halftone photosensitive film. Therefore, the black dot can be prevented.

DETAILED DESCRIPTION

Figure 1:
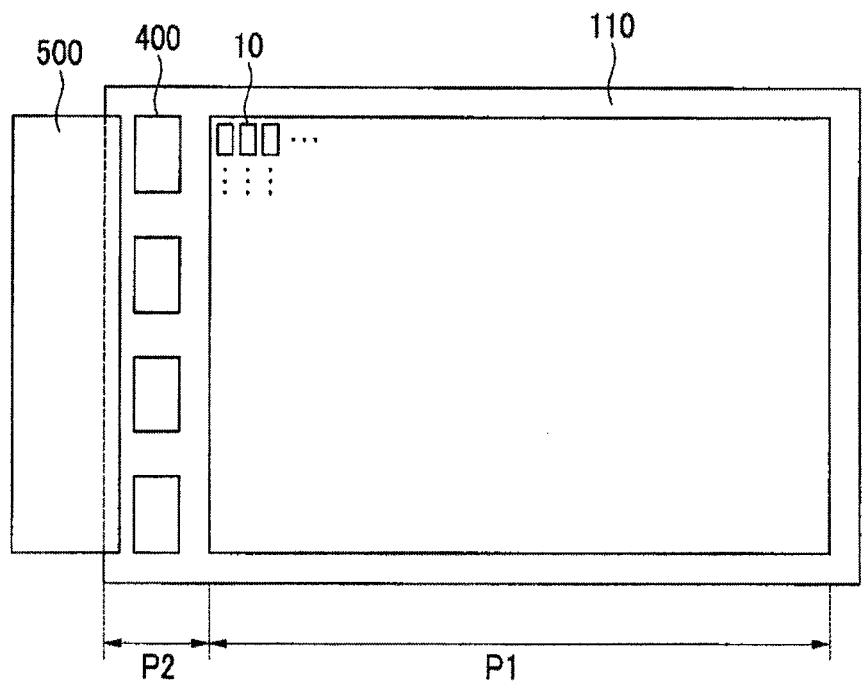
FIG. 1 shows a top plan view of a thin film transistor array panel according to an exemplary embodiment.

In the following detailed description, only certain exemplary embodiments have been shown and described, simply by way of illustration. As those skilled in the art would realize, the described embodiments may be modified in various different ways, all without departing from the spirit or scope of the present invention.

Accordingly, the drawings and description are to be regarded as illustrative in nature and not restrictive. Like reference numerals designate like elements throughout the specification.

The size and thickness of each component shown in the drawings are arbitrarily shown for understanding and ease of description, but the present invention is not limited thereto.

In the drawings, the thickness of layers, films, panels, regions, etc., are exaggerated for clarity. In addition, in the drawings, for understanding and ease of description, the thicknesses of some layers and areas are exaggerated. It will be understood that when an element such as a layer, film, region, or substrate is referred to as being "on" another element, it can be directly on the other element or intervening elements may also be present.

A thin film transistor array panel according to an exemplary embodiment will now be described in detail with reference to FIG. 1 to FIG. 6.

Figure 2:
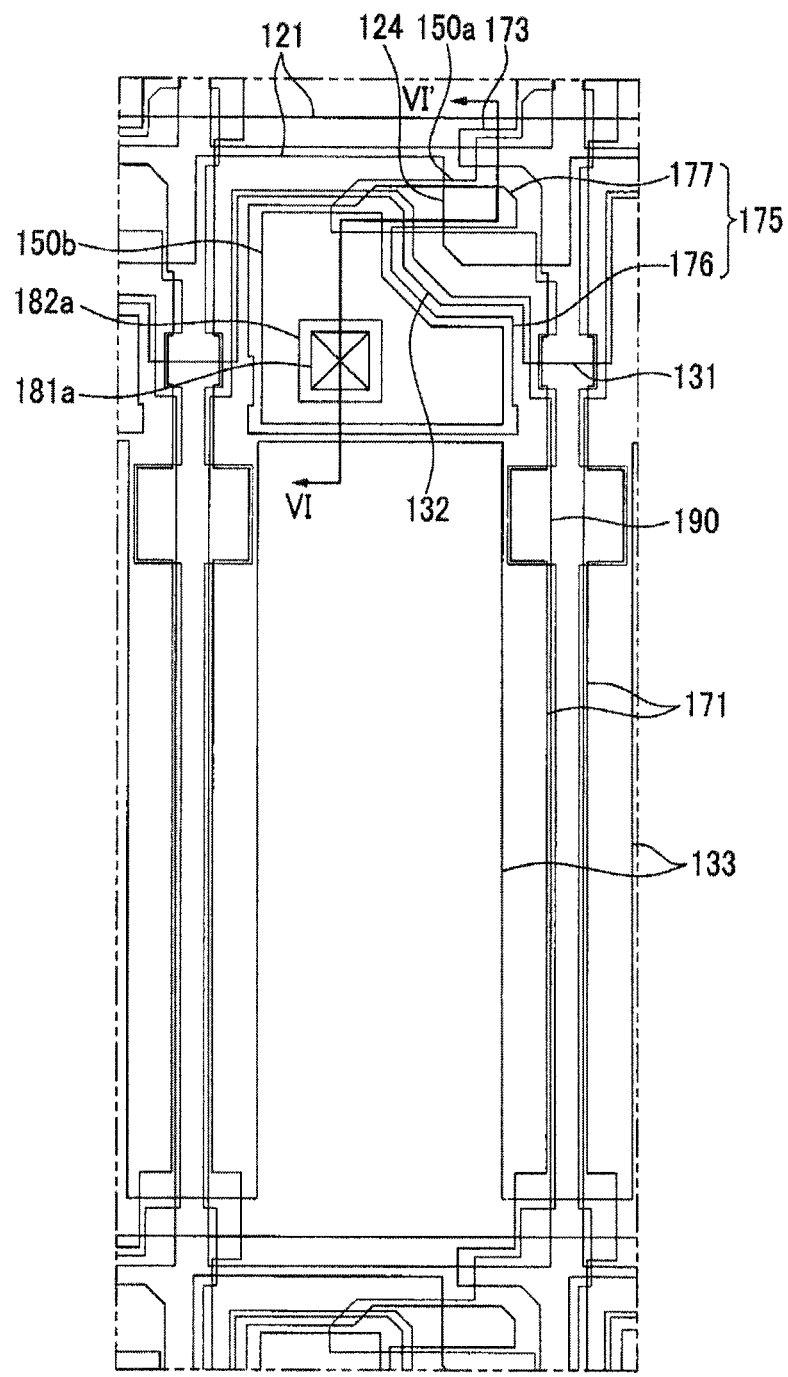
FIG. 2 shows a layout view of a pixel formed in a display area of a thin film transistor array panel according to an exemplary embodiment.
Figure 3:
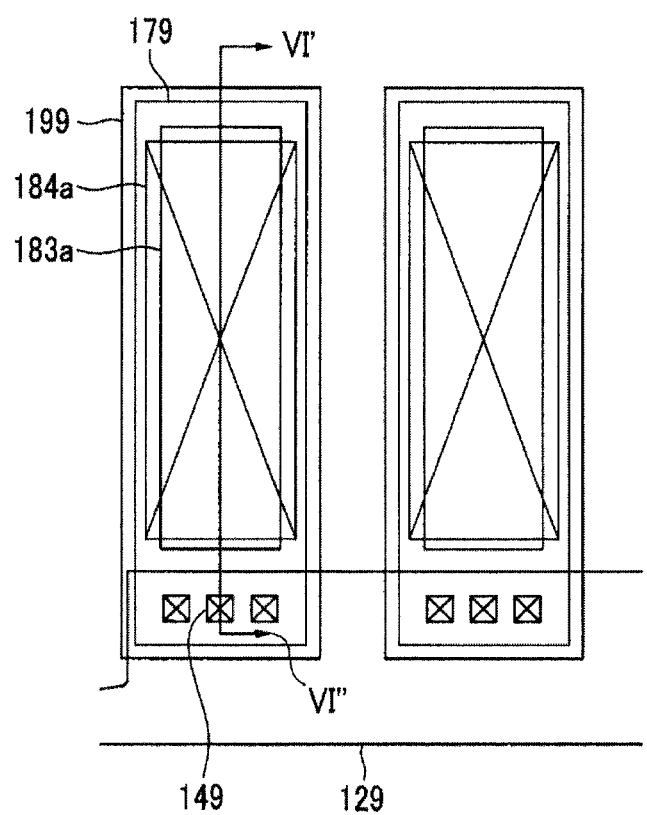
FIG. 3 shows a layout view of a COG input pad formed in a drive region of a thin film transistor array panel according to an exemplary embodiment.
Figure 4:
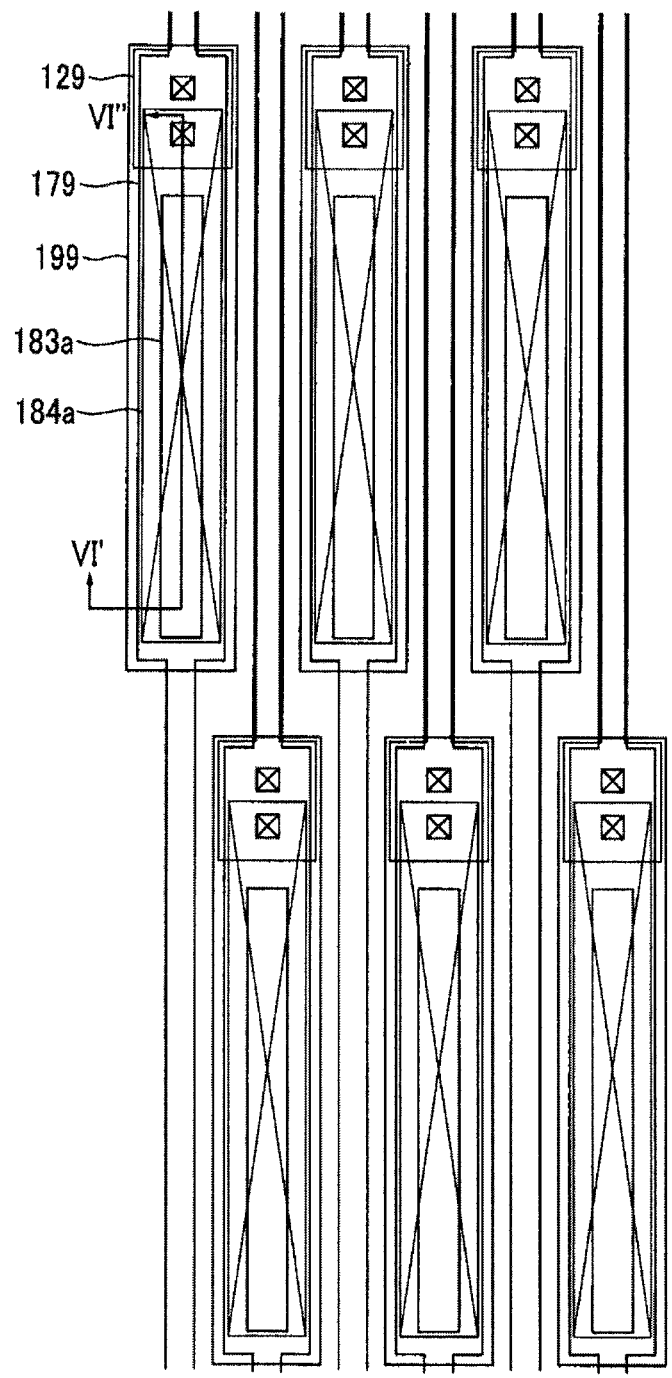
FIG. 4 shows a layout view of a COG output pad formed in a drive region of a thin film transistor array panel according to an exemplary embodiment.
Figure 5:
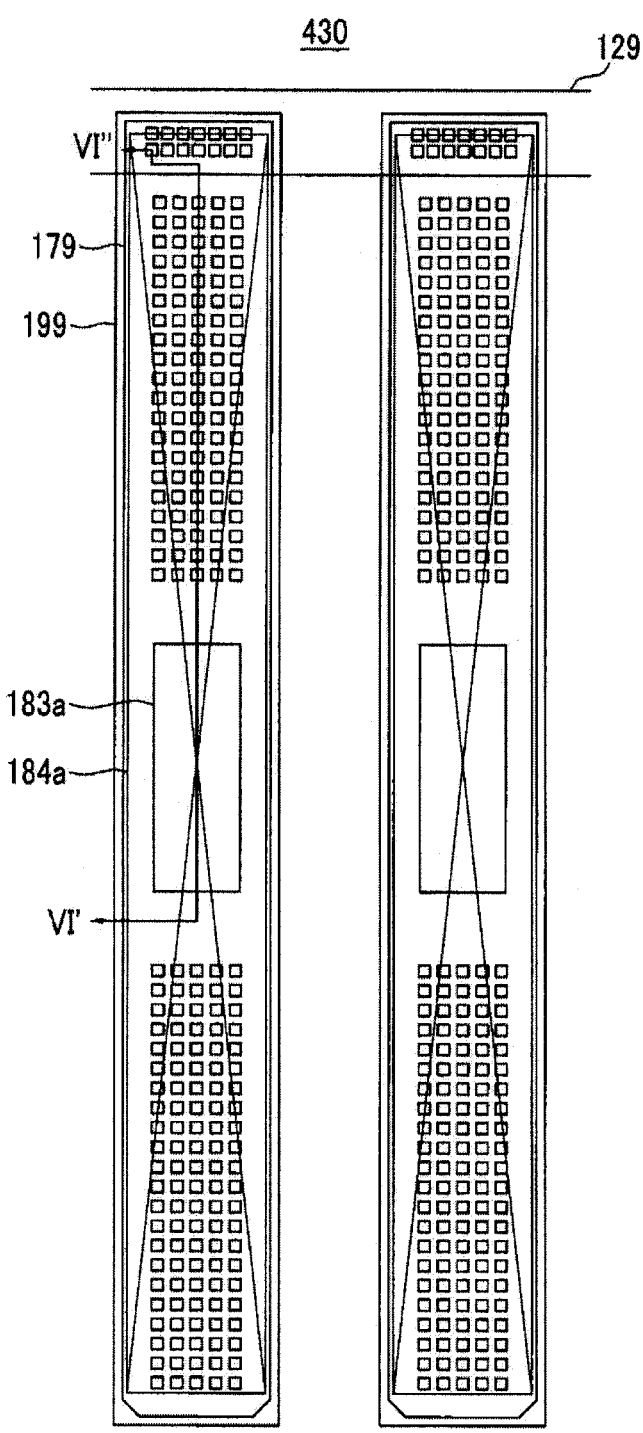
FIG. 5 shows a layout view of a FOG pad formed in a drive region of a thin film transistor array panel according to an exemplary embodiment.
Figure 6:
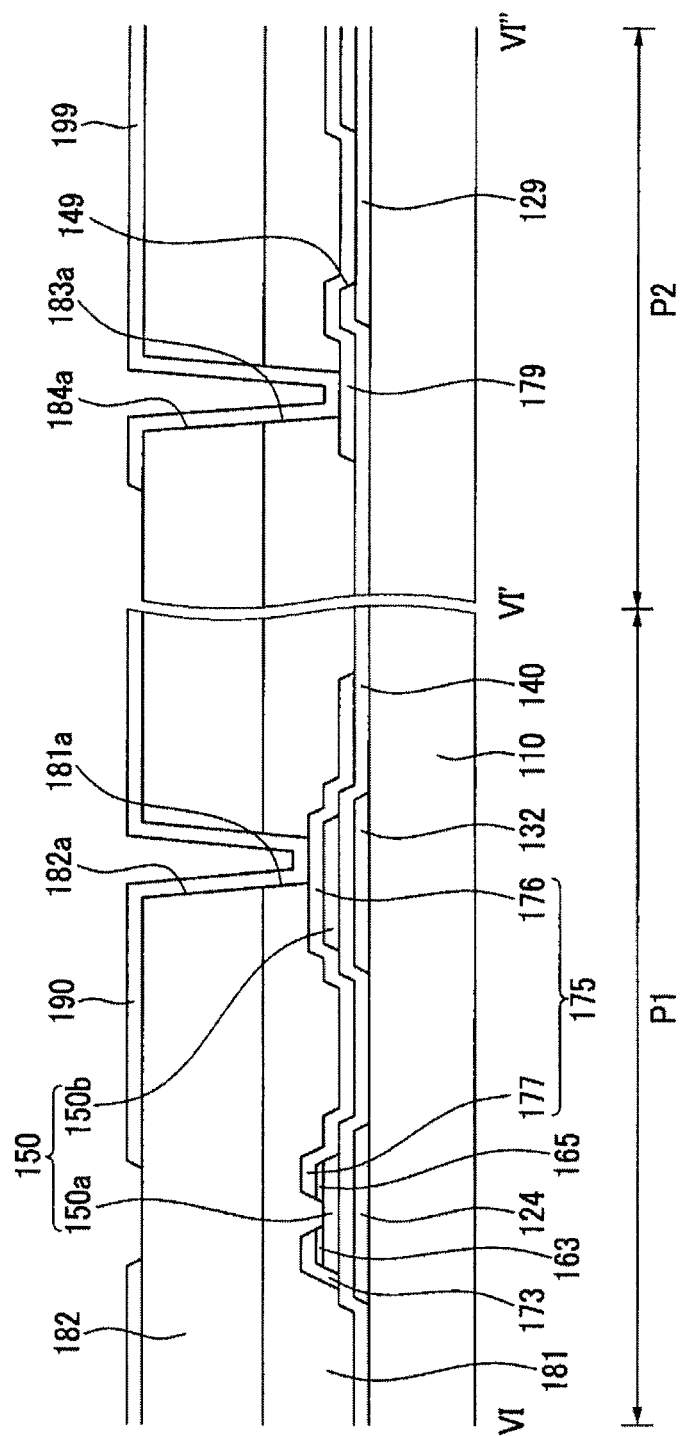
FIG. 6 shows a cross-sectional view of a thin film transistor array panel taken along the line VI-VI' of FIG. 2 and along the line VI'-VI" of FIG. 3 to FIG. 5.

FIG. 1 shows a top plan view of a thin film transistor array panel according to an exemplary embodiment, FIG. 2 shows a layout view of a pixel formed in a display area of a thin film transistor array panel according to an exemplary embodiment, FIG. 3 shows a layout view of a COG input pad formed in a drive region of a thin film transistor array panel according to an exemplary embodiment, FIG. 4 shows a layout view of a COG output pad formed in a drive region of a thin film transistor array panel according to an exemplary embodiment, FIG. 5 shows a layout view of a FOG pad formed in a drive region of a thin film transistor array panel according to an exemplary embodiment, and FIG. 6 shows a cross-sectional view of a thin film transistor array panel taken along the line VI-VI' of FIG. 2 and along the line VI'-VI" of FIG. 3 to FIG. 5.

As shown in FIG. 1 to FIG. 6, the thin film transistor array panel includes a display area P1 in which a plurality of pixels 10 are formed, and a drive region P2 in which a driving chip 400 for transmitting a driving signal to the pixels 10 is installed. The drive region P2 is coupled to a flexible printed circuit board (FPCB) 500 through an anisotropic conductive film (ACF).

As shown in FIG. 1 and FIG. 2, a gate line 121 and a storage electrode line 131 are formed in a display area P1 on a substrate 110 made of transparent glass or plastic.

The gate line 121 transmits a gate signal and extends in a first direction, that is, a horizontal direction. The gate line 121 includes a gate electrode 124 that protrudes in the downward direction of FIG. 2.

The storage electrode line 131 receives a voltage (e.g., a predetermined voltage), and is provided substantially parallel to the gate line 121. The storage electrode line 131 includes a sustain electrode 132 that protrudes in the downward direction of FIG. 2. The storage electrode line 131 includes a sustain extender 133 for extending (e.g., increasing or expanding) sustain capacity. The sustain extender 133 extends in a downward direction of FIG. 2 from the storage electrode line 131, and is overlapped with the data line 171.

A gate driving pad 129, which may be formed of the same material as the gate line 121, is formed in the drive region P2 on the substrate 110. The gate driving pad 129 is coupled to the driving chip 400 to transmit a driving signal of the driving chip 400 to another signal line within the drive region P2, or is coupled to the flexible circuit board 500 to transmit a driving signal of the flexible circuit board 500 to another signal line within the drive region P2.

FIG. 3 shows a gate driving pad formed on the COG input pad, FIG. 4 shows a gate driving pad formed on the COG output pad, and FIG. 5 shows a gate driving pad formed on the FOG pad.

The FOG pad 430 transmits a signal output by the flexible circuit board 500 to a signal line of the drive region P2, and the FOG pad 430 includes a gate driving pad 129 formed at the same layer as the gate line 121.

The COG input pad 410 transmits the signal transmitted through the FOG pad 430 by the flexible circuit board 500 to a lead line of the driving chip 400, and the COG input pad 410 includes a gate driving pad 129 formed at the same layer as the gate line 121.

The COG output pad 420 transmits the signal output by the lead line of the driving chip 400 to another signal line within the drive region P2, and the COG output pad 420 includes a gate driving pad 129 formed at the same layer as the gate line 121.

Referring to FIG. 6, gate insulating layer 140, which may be made of silicon nitride (SiNx) or silicon oxide (SiOx), is formed on the gate line 121, the storage electrode line 131, and the gate driving pad 129. The gate insulating layer 140 may have the thickness of 500 to 6000 Å.

A semiconductor layer 150, which may include amorphous silicon (a-Si), is formed on the gate insulating layer 140. The semiconductor layer 150 includes a first semiconductor layer 150a overlapped on the gate electrode 124 and a second semiconductor layer 150b overlapped on the sustain electrode 124. The first semiconductor layer 150a is separated from the second semiconductor layer 150b. The first semiconductor layer 150a and the second semiconductor layer 150b may each have a thickness of 1000 to 4000 Å.

Ohmic contact members 163 and 165 are formed on the first semiconductor layer 150a. The ohmic contact members 163 and 165 may be made of a material such as n+ hydrogenated amorphous silicon that is highly doped with an n-type impurity such as phosphorous (P) or silicide. The ohmic contact members 163 and 165 are arranged in pair on the first semiconductor layer 150a. The ohmic contact members 163 and 165 may each have a thickness of 200 to 700 Å.

A data line 171 and a drain electrode 175 are formed on the ohmic contact members 163 and 165 and the gate insulating layer 140. The data line 171 transmits the data signal and is provided in a second direction, that is, the vertical direction in FIG. 2, to cross the gate line 121. The data line 171 crosses the storage electrode line 131. The data line 171 includes a source electrode 173 that protrudes toward the gate electrode 124. The drain electrode 175 is separated (e.g., spaced apart) from the data line 171, and the drain electrode 175 is opposite to the source electrode 173 with respect to the gate electrode 124.

The drain electrode 175 includes a drain bar 177 facing the source electrode 173, and a drain extender 176 that is at an end part of a wide area. The drain extender 176 is overlapped with the sustain electrode 132. The source electrode 173 and the drain bar 177 are partially overlapped with the first semiconductor layer 150a, and the drain extender 176 is partially overlapped with the second semiconductor layer 150b. Therefore, the second semiconductor layer 150b may prevent the drain extender 176 and the sustain electrode 132 from being short-circuited when a halftone photosensitive film 50 for forming a gate driving pad contact hold and a semiconductor layer have foreign particles or bubbles.

The gate electrode 124, the source electrode 173, and the drain electrode 175 configure a thin film transistor (TFT) with the semiconductor layer 150, and a channel of the thin film transistor is formed on the first semiconductor layer 150a between the source electrode 173 and the drain electrode 175.

The ohmic contact members 163 and 165 exist among the first semiconductor layer 150a, the source electrode 173, and the drain electrode 175 and reduce contact resistance among them.

A gate driving pad contact hole 149 for exposing the gate driving pad 129 is formed on the gate insulating layer 140 of the drive region P2. A connecting member 179 is formed on the gate insulating layer 140 of the drive region P2, and the connecting member 179 is coupled to the gate driving pad 129 through the gate driving pad contact hole 149.

A passivation layer 181 is formed on the data line 171, the drain electrode 175, and the exposed first semiconductor layer 150a. The passivation layer 181 may be made of an inorganic insulation material such as silicon nitride or silicon oxide for preventing any damage to the first semiconductor layer 150a. A first contact hole 181a for exposing the drain extender 176 of the drain electrode 175 is formed in the passivation layer 181.

An organic layer 182 made of an organic insulation material with an excellent insulation characteristic is formed on the passivation layer 181, and the surface of the organic layer 182 may be made planar. A second contact hole 182a for exposing the drain extender 176 of the drain electrode 175 is formed in the organic layer 182. The second contact hole 182a is formed to be overlapped with the first contact hole 181a.

A first connecting member hole 183a for exposing the connecting member 179 is formed in the passivation layer 181 of the drive region P2, and a second connecting member hole 184a is formed in the organic layer 182 of the drive region P2 and is overlapped on the first connecting member hole 183a.

A pixel electrode 190 is formed on the organic layer 182. The pixel electrode 190 contacts and is electrically coupled to the drain extender 176 of the drain electrode 175 through the first contact hole 181a and the second contact hole 182a, and receives a data voltage from the drain electrode 175. The pixel electrode 190 may be made of a transparent conducting material such as ITO or IZO.

The pixel electrode 190 to which the data voltage is applied generates an electric field together with the common electrode of the color filter array panel, which receives the common voltage, to determine the direction of the liquid crystal molecules of the liquid crystal layer between two electrodes. The pixel electrode 190 and the common electrode form a capacitor (referred to as a liquid crystal capacitor hereinafter) to sustain the applied voltage after the thin film transistor is turned off.

The drain extender 176 of the drain electrode 175 coupled to the pixel electrode 190 is overlapped with the sustain electrode 132 to form a sustain capacitor. The sustain capacitor reinforces (e.g., improves) voltage sustain performance of the liquid crystal capacitor.

An auxiliary member (e.g., an auxiliary electrode) 199 coupled to the connecting member 179 through the first connecting member hole 183a and the second connecting member hole 184a is formed on the organic layer 182 at the drive region P2. The auxiliary member 199 may be made of a transparent conducting material such as ITO or IZO. The lead line of the gate driving chip 400 contacts the auxiliary member 199, and is coupled to the gate driving pad 129 through the connecting member 179.

A method for manufacturing a thin film transistor array panel according to an exemplary embodiment will now be described with reference to FIG. 7 to FIG. 10.

FIG. 7 to FIG. 10 sequentially show a method for manufacturing a thin film transistor array panel of FIG. 6.

Figure 7:
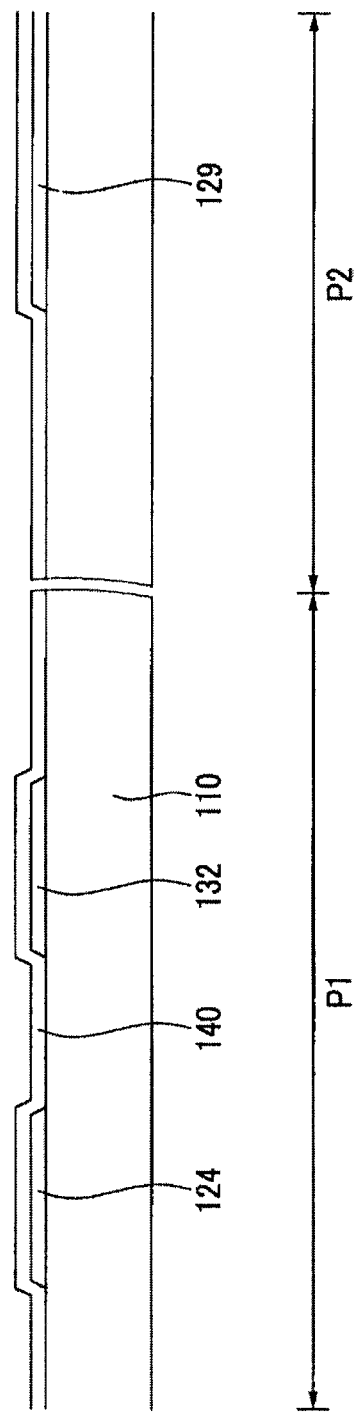
FIG. 7 to FIG. 10 sequentially show a method for manufacturing a thin film transistor array panel of FIG. 6.

First, as shown in FIG. 7, a gate line 121 (e.g., shown in FIG. 2) including a gate electrode 124, and a storage electrode line 131 (e.g., shown in FIG. 2) including a storage electrode 132 are formed in the display area P1 on the transparent substrate 110. A gate driving pad 129 is formed in the drive region P2 on the substrate 110. A gate insulating layer 140 is formed on the gate line 121, the storage electrode line 131, and the gate driving pad 129.

Figure 8:
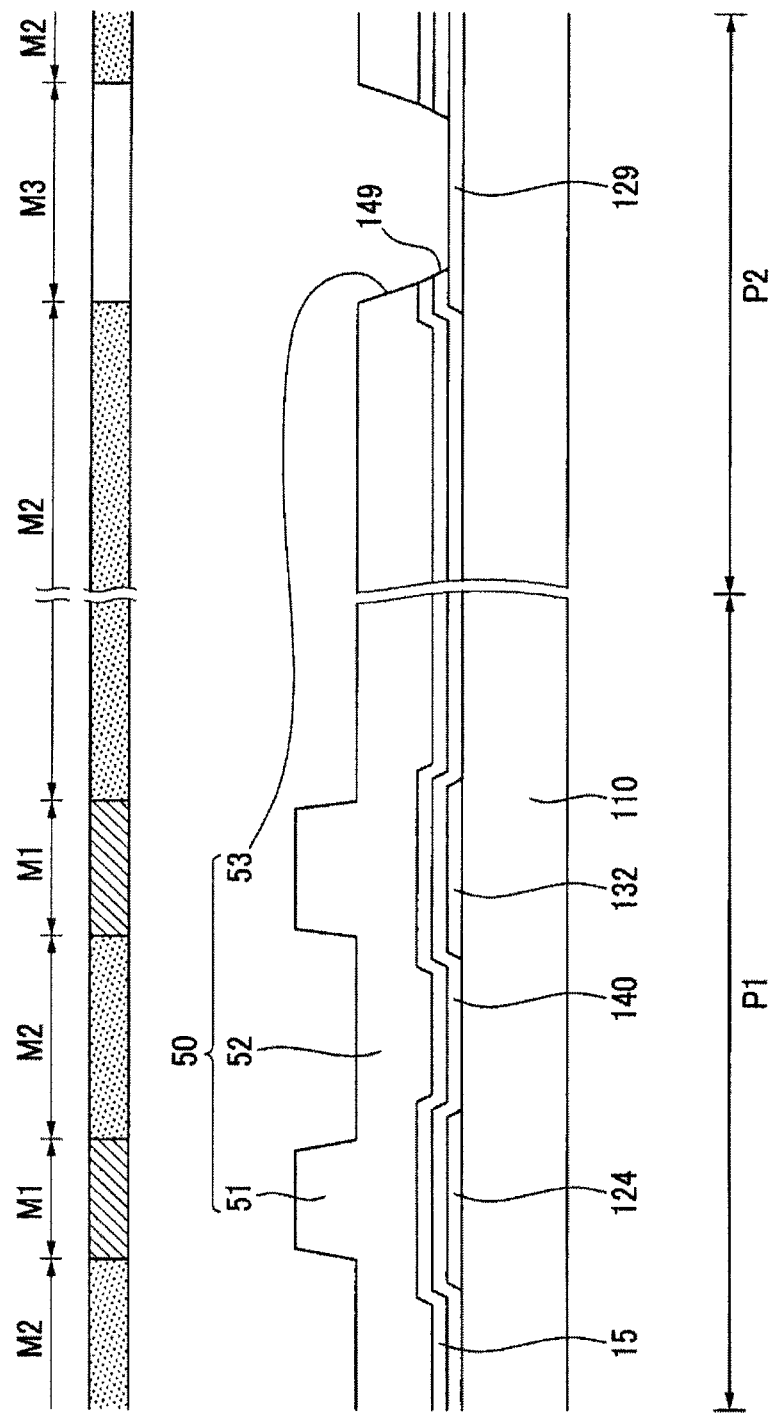

As shown in FIG. 8, a semiconductor layer 15 is formed on the gate insulating layer 140. A halftone photosensitive film 50 including a first exposer 51, a second exposer 52 that is thinner than the first exposer 51, and a third exposer 53 for exposing the semiconductor layer 15 is formed on the semiconductor layer 15. The halftone photosensitive film 50 is formed by using a halftone mask (M) including a shutter M1 corresponding to the first exposer 51, a translucent unit M2 corresponding to the second exposer 52, and a transmitter M3 corresponding to the third exposer 53. Transmittance of the translucent unit M2 of the halftone mask (M) corresponding to the second exposer 52 of the halftone photosensitive film 50 may be 20% to 65%.

The first exposer 51 is formed with a thickness of 10,000 to 50,000 Å, and the second exposer 52 is formed with a thickness of 5,000 to 30,000 Å.

When the thickness of the first exposer 51 is less than 10,000 Å, the thickness of the first exposer 51 may be reduced and may not function as an etch mask during an etch back process of the second exposer 52, and when the thickness of the first exposer 51 is greater than 50,000 Å, the first exposer 51 may not be completely removed through the etch back process and the strip process and it may remain and act as foreign particles.

When the thickness of the second exposer 52 is less than 5,000 Å, the second exposer 52 may not cover the semiconductor layer because of foreign particles or bubbles, and when the thickness of the second exposer 52 is greater than 30,000 Å, it may not be removed during the etch back process of the second exposer 52 and may remain and act as foreign particles.

In this instance, the first exposer 51 is formed on a position corresponding to the first semiconductor layer 150a and the second semiconductor layer 150b, and the third exposer 53 is formed on a position corresponding to the gate driving pad contact hole 149.

The semiconductor layer 15 and the gate insulating layer 140 are sequentially etched through the third exposer 53 to form a gate driving pad contact hole 149 for exposing the gate driving pad 129.

Figure 9:
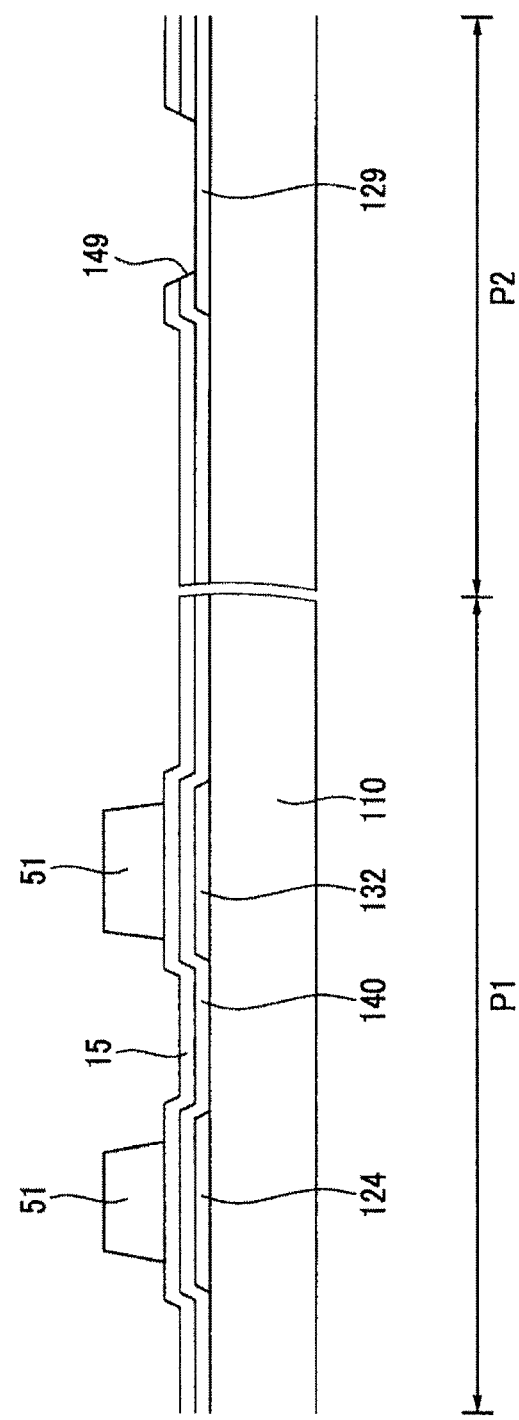

As shown in FIG. 9, the halftone photosensitive film 50 is etched back to remove the second exposer 52. Hence, the semiconductor layer 15 is exposed. In this instance, the first exposer 51 is not removed completely but becomes thinner because it is thicker than the second exposer 52. Therefore, the first exposer 51 is used as an etch mask for the semiconductor layer 15 in the subsequent process.

Figure 10:
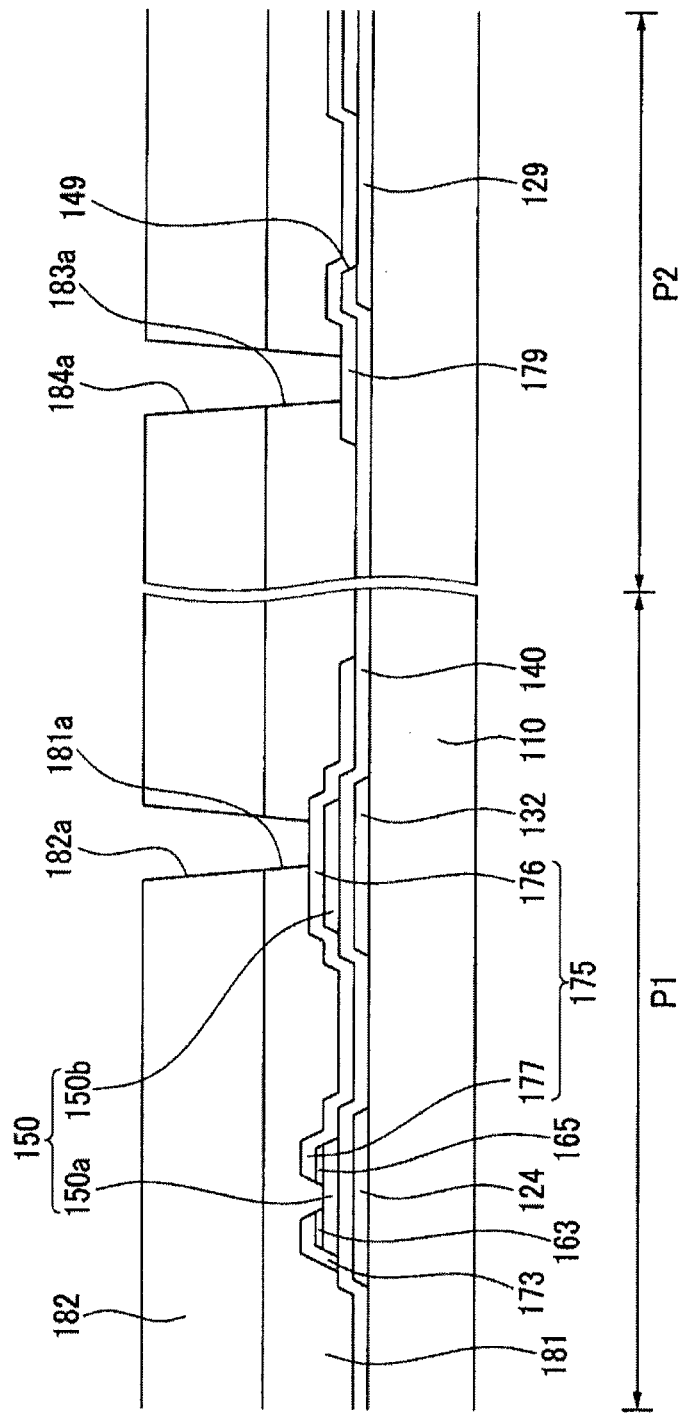

Next, as shown in FIG. 10, the semiconductor layer 15 is etched by using the first exposer 51 as an etch mask to form a first semiconductor layer 150a and a second semiconductor layer 150b. In this instance, the first semiconductor layer 150a is formed at a position overlapped with the gate electrode 124, and the second semiconductor layer 150b is formed at a position overlapped with the sustain electrode 132.

Accordingly, the second semiconductor layer 150b is formed on the part corresponding to the sustain electrode 132 so the second semiconductor layer 150b may prevent the foreign particles or the bubbles from being connected to the sustain electrode 132 when the second exposer 52 of the halftone photosensitive film 50 has the foreign particles or the bubbles. Therefore, the black dot problem may be prevented by preventing a short circuit of the sustain electrode 132 and the drain electrode 175 caused by the foreign particles or the bubbles.

A data line 171 (e.g., shown in FIG. 2) crossing the gate line 121 (e.g., shown in FIG. 2) in an insulated manner and a drain electrode 175 separated from the data line 171 (e.g., shown in FIG. 2) are formed on the gate insulating layer 140. In this instance, a drain bar 177 of the drain electrode 175 is formed at a position facing the source electrode 173, and a drain extender 176 is formed at a position overlapped with the second semiconductor layer 150b. The source electrode 173 and the drain bar 177 of the drain electrode 175 are formed to be partially overlapped with the first semiconductor layer 150a. When the source electrode 173 and the drain electrode 175 are formed, a connecting member 179 coupled to the gate driving pad 129 through the gate driving pad contact hole 149 is formed.

A passivation layer 181 and an organic layer 182 for covering the source electrode 173 and the drain electrode 175 are sequentially formed. The organic layer 182 is etched to form the second contact hole 182a, and the passivation layer 181 exposed by the second contact hole 182a is etched to form a first contact hole 181a for exposing the drain extender 176 of the drain electrode 175. When the second contact hole 182a is formed, a second connecting member hole 184a is formed on the organic layer at the drive region P2, and when the first contact hole 181a is formed, the organic layer 182 exposed by the second connecting member hole 184a is etched to form a first connecting member hole 183a for exposing the connecting member 179.

As shown in FIG. 6, a pixel electrode 190 coupled to the drain extender 176 of the drain electrode 175 is formed through the first contact hole 181a and the second contact hole 182a in the organic layer 182. When the pixel electrode 190 is formed, an auxiliary member 199 coupled to the connecting member 179 through the first connecting member hole 183a and the second connecting member hole 184a is formed on the organic layer 182 at the drive region P2.

As stated above, the first contact hole 181a and the second contact hole 182a are concurrently (e.g., simultaneously) formed with a single mask, but the first contact hole 181a and the second contact hole 182a may be formed with different masks. That is, a passivation layer 181 for covering the source electrode 173 and the drain electrode 175 is formed, and the first contact hole 181a for exposing the drain extender 176 of the drain electrode 175 is formed on the passivation layer 181 with a single mask. An organic layer 182 is formed on the passivation layer 181, and the second contact hole 182a is formed on a position corresponding to the first contact hole 181a of the organic layer 182 by using another mask, thereby exposing the drain extender 176 of the drain electrode 175.

While embodiments of the present invention have been described primarily in reference to a thin film transistor array panel of a transmissive liquid crystal display (LCD), embodiments of the present invention are also applicable to a thin film transistor array panel of a transflective liquid crystal display (LCD).

Figure 11:
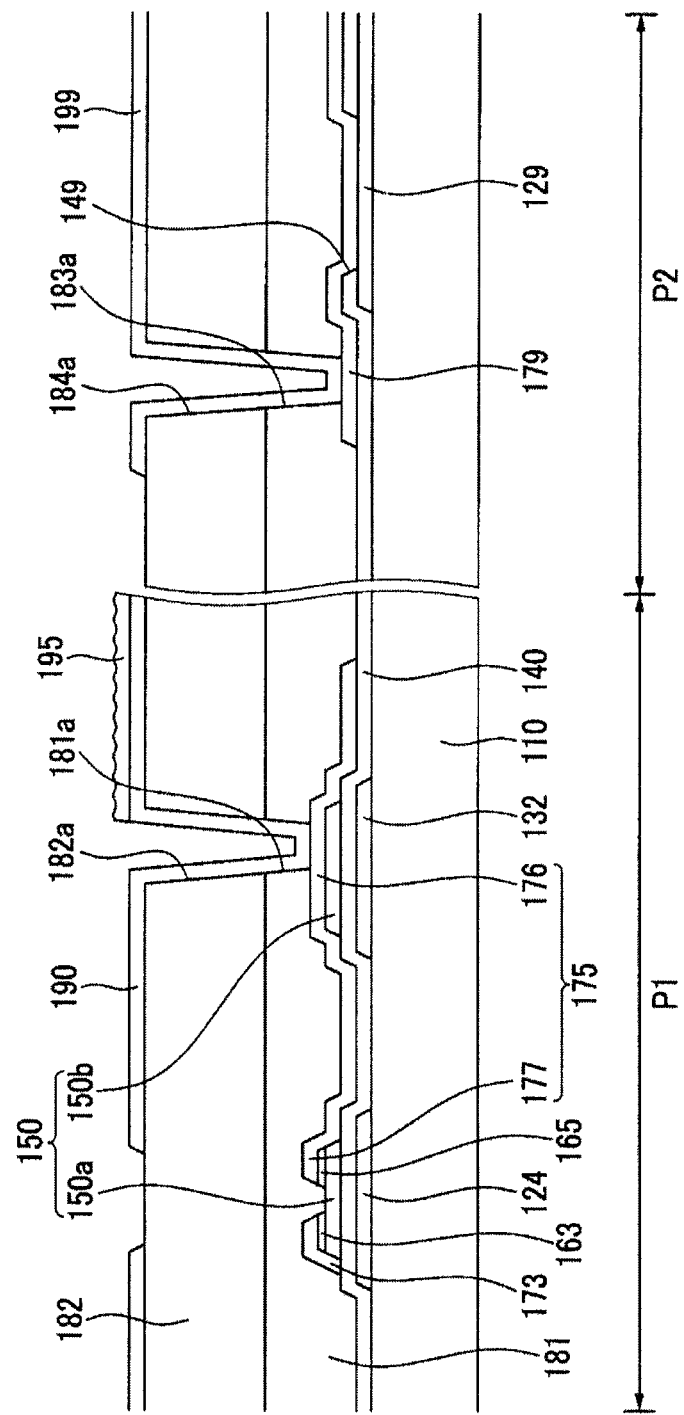
FIG. 11 shows a cross-sectional view of a thin film transistor array panel according to another exemplary embodiment.

FIG. 11 shows a cross-sectional view of a thin film transistor array panel according to another exemplary embodiment.

The exemplary embodiment shown with reference to FIG. 11 substantially corresponds to the exemplary embodiment described with reference to FIG. 6 other than the formation of a reflecting electrode, and no repeated description will be provided.

As shown in FIG. 11, the pixel 10 (e.g., shown in FIG. 1) may include a transmitting region and a reflecting region. In this embodiment, a reflecting electrode 195 is formed on the pixel electrode 190 at the reflecting region. The reflecting electrode 195 is made of reflecting metals such as aluminum, silver, or alloys thereof.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims and their equivalents.

What is claimed is:

1. A method for manufacturing a thin film transistor array panel, the method comprising:
    forming a gate line and a storage electrode line in a display area on a substrate for a plurality of pixels;
    forming a gate driving pad in a drive region on the substrate for a driving chip for transmitting a driving signal to the pixels;
    forming a gate insulating layer on the gate line, the storage electrode line, and the gate driving pad;
    forming a first semiconductor layer overlapping a gate electrode protruding from the gate line on the gate insulating layer;
    forming a second semiconductor layer overlapped with a sustain electrode protruding from the storage electrode line;
    forming on the gate insulating layer a data line crossing the gate line and a drain electrode separated from the data line, the data line being insulated from the gate line, and the drain electrode comprising a drain bar facing a source electrode protruding from the data line, and a drain extender overlapping with the second semiconductor layer; and
    forming a pixel electrode coupled to the drain electrode.

2. The method of claim 1, wherein the first semiconductor layer overlaps the source electrode and the drain bar.

3. The method of claim 1, wherein the forming of the first semiconductor layer and the second semiconductor layer comprises:
    forming a semiconductor layer on the gate insulating layer;
    forming a halftone photosensitive film including a first exposer, a second exposer that is thinner than the first exposer, and a third exposer for exposing the semiconductor layer on the semiconductor layer;
    forming a gate driving pad contact hole for exposing the gate driving pad by etching the semiconductor layer and the gate insulating layer through the third exposer; etching back the halftone photosensitive film to remove the second exposer to expose the semiconductor layer; and
    forming the first semiconductor layer and the second semiconductor layer by etching the semiconductor layer by using the first exposer as a mask.

4. The method of claim 3, wherein the first exposer is located at a position corresponding to the first semiconductor layer and the second semiconductor layer.

5. The method of claim 3, wherein the first exposer has a thickness of 10,000 Å to 50,000 Å, and the second exposer has a thickness of 5,000 Å to 30,000 Å.

6. The method of claim 3, wherein when the second exposer is removed, the first exposer becomes thinner.

7. The method of claim 3, further comprising:
    forming a passivation layer for covering the source electrode and drain electrode;
    forming an organic layer on the passivation layer; and
    forming a first contact hole and a second contact hole for exposing a drain extender of the drain electrode in the passivation layer and the organic layer, respectively.

8. The method of claim 7, further comprising:
    when the source electrode and the drain electrode are formed, forming a connecting member connected to the gate driving pad through the gate driving pad contact hole.

9. The method of claim 8, further comprising,
when the first contact hole and the second contact hole are formed, forming a first connecting member hole and a second connecting member hole for exposing the connecting member in the passivation layer and the organic layer, respectively, at the drive region.

10. The method of claim 9, further comprising,
when the pixel electrode is formed, forming an auxiliary member coupled to the connecting member through the first connecting member hole and the second connecting member hole on the organic layer at the drive region.

11. The method of claim 3, further comprising:
forming a passivation layer for covering the source electrode and the drain electrode;
forming a first contact hole in the passivation layer to expose a drain extender of the drain electrode;
forming an organic layer on the passivation layer; and
exposing the drain extender of the drain electrode by forming a second contact hole in the organic layer at a position corresponding to the first contact hole.

12. The method of claim 11, further comprising,
when the source electrode and the drain electrode are formed, forming a connecting member connected to the gate driving pad through the gate driving pad contact hole.

13. The method of claim 12, further comprising,
when the first contact hole and the second contact hole are formed, forming a first connecting member hole and a second connecting member hole for exposing the connecting member in the passivation layer and the organic layer, respectively, at the drive region.

14. The method of claim 13, further comprising,
when the pixel electrode is fanned, forming an auxiliary member coupled to the connecting member through the first connecting member hole and the second connecting member hole on the organic layer at the drive region.

15. A thin film transistor array panel manufactured according to the method of claim 1.

16. A thin film transistor array panel comprising:
a substrate comprising a display area in which a plurality of pixels are formed and a drive region in which a driving chip for transmitting a driving signal to the pixels is located;
a gate line in the display area;
a storage electrode line in the display area and separated from the gate line;
a gate driving pad in the drive region and coupled to the driving chip;
a gate insulating layer for covering the gate line, the storage electrode line, and the gate driving pad;
a first semiconductor layer on the gate insulating layer and overlapped with a gate electrode protruding from the gate line;
a second semiconductor layer on the gate insulating layer and overlapped with a sustain electrode protruding from the storage electrode line;
a data line on the gate insulating layer and crossing the gate line in an insulated manner and a drain electrode separated from the data line; and
a pixel electrode coupled to the drain electrode, wherein the drain electrode comprises a drain bar facing a source electrode protruding from the data line, and a drain extender overlapped with the second semiconductor layer.

17. The thin film transistor array panel of claim 16, wherein the first semiconductor layer overlaps with the source electrode and the drain bar.

18. The thin film transistor array panel of claim 16, further comprising:
a passivation layer covering the data line and having a first contact hole that exposes a drain extender of the drain electrode; and
an organic layer on the passivation layer and having a second contact hole that exposes the drain extender of the drain electrode, wherein
the pixel electrode is on the organic layer and is coupled to the drain electrode through the first contact hole and the second contact hole.

19. The thin film transistor array panel of claim 18, further comprising:
a connecting member on the gate insulating layer of the drive region and coupled to the gate driving pad; and
an auxiliary member on the organic layer and coupled to the connecting member.

20. The thin film transistor array panel of claim 19, wherein the connecting member is coupled to the gate driving pad through a gate driving pad contact hole in the gate insulating layer, and
the auxiliary member is coupled to the connecting member through a first connecting member hole in the passivation layer and a second connecting member hole in the organic layer.

* * * * *